United States Patent
Koniaris et al.

(10) Patent No.: US 7,112,978 B1
(45) Date of Patent: *Sep. 26, 2006

(54) FREQUENCY SPECIFIC CLOSED LOOP FEEDBACK CONTROL OF INTEGRATED CIRCUITS

(75) Inventors: Kleanthes G. Koniaris, Palo Alto, CA (US); James B. Burr, Foster City, CA (US)

(73) Assignee: Transmeta Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/956,217

(22) Filed: Sep. 30, 2004

Related U.S. Application Data (63) Continuation-in-part of application No. 10/672,793, filed on Sep. 26, 2003, now Pat. No. 6,885,210, and a continuation-in-part of application No. 10/334,918, filed on Dec. 31, 2002, and a continuation-in-part of application No. 10/124,152, filed on Apr. 16, 2002, now Pat. No. 6,882,172.

(51) Int. Cl.
*G01R 31/26* (2006.01)

(52) U.S. Cl. .................................... 324/763

(58) Field of Classification Search .................... None
See application file for complete search history.

(56) References Cited

U.S. PATENT DOCUMENTS

| | | | |
|---|---|---|---|
| 5,086,501 A | 2/1992 | DeLuca et al. | 395/550 |
| 5,167,024 A | 11/1992 | Smith et al. | 395/375 |
| 5,201,059 A | 4/1993 | Nguyen | 395/800 |
| 5,204,863 A | 4/1993 | Saint-Joigny et al. | 371/16.3 |
| 5,218,704 A | 6/1993 | Watts, Jr. et al. | 395/750 |
| 5,230,055 A | 7/1993 | Katz et al. | 395/750 |
| 5,239,652 A | 8/1993 | Seibert et al. | 395/750 |
| 5,422,806 A | 6/1995 | Chen et al. | |
| 5,461,266 A | 10/1995 | Koreeda et al. | |
| 5,502,838 A | 3/1996 | Kikinis | |
| 5,511,203 A | 4/1996 | Wisor et al. | 395/750 |
| 5,560,020 A | 9/1996 | Nakatani et al. | 395/750 |
| 5,592,173 A | 1/1997 | Lau et al. | 342/357 |
| 5,682,093 A | 10/1997 | Kivela | 323/273 |
| 5,692,204 A | 11/1997 | Rawson et al. | |
| 5,717,319 A | 2/1998 | Jokinen | 323/280 |
| 5,719,800 A | 2/1998 | Mittal et al. | |
| 5,745,375 A | 4/1998 | Reinhardt et al. | 364/492 |
| 5,752,011 A | 5/1998 | Thomas et al. | 395/556 |
| 5,754,869 A | 5/1998 | Holzhammer et al. | |
| 5,757,171 A | 5/1998 | Babcock | 323/271 |

(Continued)

FOREIGN PATENT DOCUMENTS

EP 0381021 A2 8/1990

(Continued)

OTHER PUBLICATIONS

"High-Speed, Digitally Adustedstepdown Controllers for Notebook CPUS"; Maxim Manual; pp. 11 & 21.

(Continued)

*Primary Examiner*—Jermele Hollington (57) ABSTRACT

Systems and methods for frequency specific closed loop feedback control of integrated circuits. In one embodiment, a plurality of controllable inputs to an integrated circuit is adjusted to achieve a frequency specific predetermined value of a dynamic operating indicator of the integrated circuit at the desired specific operating frequency. The predetermined value is stored in a data structure within a computer usable media. The data structure comprises a plurality of frequency specific predetermined values for a variety of operating frequencies. An operating condition of an integrated circuit is controlled via closed loop feedback based on dynamic operating indicators of the measured behavior of the integrated circuit.

26 Claims, 6 Drawing Sheets

U.S. PATENT DOCUMENTS

| | | | |
|---|---|---|---|
| 5,778,237 A | 7/1998 | Yamamoto et al. | 395/750.04 |
| 5,815,724 A | 9/1998 | Mates | |
| 5,825,674 A | 10/1998 | Jackson | 364/707 |
| 5,848,281 A | 12/1998 | Smalley et al. | 395/750.04 |
| 5,884,049 A | 3/1999 | Atkinson | 395/281 |
| 5,894,577 A | 4/1999 | MacDonald et al. | 395/733 |
| 5,923,545 A | 7/1999 | Nguyen | 363/24 |
| 5,933,649 A | 8/1999 | Lim et al. | 395/750.04 |
| 5,940,785 A | 8/1999 | Georgiou et al. | 702/132 |
| 5,940,786 A | 8/1999 | Steeby | 702/132 |
| 5,974,557 A | 10/1999 | Thomas et al. | 713/322 |
| 5,996,083 A | 11/1999 | Gupta et al. | 713/322 |
| 5,996,084 A | 11/1999 | Watts | 713/323 |
| 6,047,248 A | 4/2000 | Georgiou et al. | 702/132 |
| 6,048,746 A | 4/2000 | Burr | 438/17 |
| 6,078,319 A | 6/2000 | Bril et al. | 345/211 |
| 6,087,892 A | 7/2000 | Burr | 327/534 |
| 6,091,283 A | 7/2000 | Murgula et al. | 327/537 |
| 6,118,306 A | 9/2000 | Orton et al. | 327/44 |
| 6,119,241 A | 9/2000 | Michail et al. | 713/322 |
| 6,141,762 A | 10/2000 | Nicol et al. | 713/300 |
| 6,157,092 A | 12/2000 | Hofmann | 307/11 |
| 6,202,104 B1 | 3/2001 | Ober | 710/18 |
| 6,216,235 B1 | 4/2001 | Thomas et al. | 713/501 |
| 6,218,708 B1 | 4/2001 | Burr | 257/372 |
| 6,272,642 B1 | 8/2001 | Pole, III et al. | 713/300 |
| 6,279,048 B1 | 8/2001 | Fadavi-Ardekani et al. | 710/15 |
| 6,303,444 B1 | 10/2001 | Burr | 438/289 |
| 6,304,824 B1 | 10/2001 | Bausch et al. | 702/64 |
| 6,311,287 B1 | 10/2001 | Dischler et al. | 713/601 |
| 6,314,522 B1 | 11/2001 | Chu et al. | 713/322 |
| 6,345,363 B1 | 2/2002 | Levy-Kendler | 713/320 |
| 6,347,379 B1 | 2/2002 | Dai et al. | 713/320 |
| 6,378,081 B1 | 4/2002 | Hammond | 713/501 |
| 6,388,432 B1 | 5/2002 | Uchida | 323/266 |
| 6,415,388 B1 | 7/2002 | Browning et al. | 713/322 |
| 6,427,211 B1 | 7/2002 | Watts, Jr. | 713/320 |
| 6,442,746 B1 | 8/2002 | James et al. | 716/14 |
| 6,457,135 B1 | 9/2002 | Cooper | 713/323 |
| 6,477,654 B1 | 11/2002 | Dean et al. | 713/300 |
| 6,487,668 B1 | 11/2002 | Thomas et al. | 713/322 |
| 6,489,224 B1 | 12/2002 | Burr | 438/526 |
| 6,510,400 B1 | 1/2003 | Moriyama | 702/132 |
| 6,510,525 B1 | 1/2003 | Nookala et al. | 713/324 |
| 6,513,124 B1 | 1/2003 | Furuichi et al. | 713/322 |
| 6,519,706 B1 | 2/2003 | Ogoro | 713/322 |
| 6,574,739 B1 | 6/2003 | Kung et al. | 713/322 |
| 6,882,172 B1 * | 4/2005 | Suzuki et al. | 324/769 |
| 6,885,210 B1 * | 4/2005 | Suzuki | 324/763 |
| 2002/0026597 A1 | 2/2002 | Dai et al. | 713/322 |
| 2002/0073348 A1 | 6/2002 | Tani | 713/300 |
| 2002/0083356 A1 | 6/2002 | Dai | 713/322 |
| 2002/0138778 A1 | 9/2002 | Cole et al. | 713/330 |
| 2003/0065960 A1 | 4/2003 | Rusu et al. | 713/300 |
| 2003/0074591 A1 | 4/2003 | McClendon et al. | 713/322 |

FOREIGN PATENT DOCUMENTS

| | | |
|---|---|---|
| EP | 0501655 A2 | 2/1992 |
| EP | 0474963 A2 | 3/1992 |
| JP | 409185589 A | 7/1997 |
| WO | WO0127728 | 4/2001 |

OTHER PUBLICATIONS

"Operatio U (Refer to Functional Diagram)"; LTC 1736;, Linear Technology Manual; p. 9.

Desai et al.; "Sizing of Clock Distribution Networks for High Performance CPU Chips"; Digital Equipment Corp., Hudson, MA; pp. 389-394; 1996.

* cited by examiner

FREQUENCY SPECIFIC CLOSED LOOP FEEDBACK CONTROL OF INTEGRATED CIRCUITS

RELATED APPLICATIONS

This application is a continuation in part of commonly owned U.S. patent application Ser. No. 10/124,152, filed Apr. 16, 2002, now U.S. Pat. No. 6,882,172, entitled "System and Method for Measuring Transistor Leakage Current with a Ring Oscillator" to Suzuki and Burr, which is hereby incorporated herein by reference in its entirety.

This application is a continuation in part of commonly owned U.S. patent application Ser. No. 10/672,793, filed Sep. 26, 2003, now U.S. Pat. No. 6,885,210, entitled "A System and Method for Measuring Transistor Leakage Current with a Ring Oscillator with Backbias Controls" to Suzuki, which is hereby incorporated herein by reference in its entirety.

This application is a continuation in part of co-pending, commonly owned U.S. patent application Ser. No. 10/334,918, filed Dec. 31, 2002, entitled "Adaptive Power Control" to Burr et al., which is hereby incorporated herein by reference in its entirety.

FIELD OF THE INVENTION

Embodiments in accordance with the present invention relate to systems and methods for frequency specific closed loop feedback control of integrated circuits.

BACKGROUND

In order to operate an integrated circuit, e.g., a microprocessor, in an efficient manner, for example, to consume a low amount of energy to accomplish a task, it is known to adjust various controlling parameters. These parameters may include an operating voltage that can be adjusted to a value characteristic of an advantageous power condition in accordance with the task to be accomplished. For example, an operating voltage is set to a minimized value consistent with a desired frequency of operation. In the conventional art, such operating points are determined in an open loop manner.

SUMMARY OF THE INVENTION

Therefore, systems and methods for frequency specific closed loop feedback control of integrated circuits are highly desired.

Accordingly, systems and methods for frequency specific closed loop feedback control of integrated circuits are disclosed. In one embodiment, a plurality of controllable inputs to an integrated circuit is adjusted to achieve a frequency specific predetermined value of a dynamic operating indicator of the integrated circuit at the desired specific operating frequency. The predetermined value is stored in a data structure within a computer usable media. The data structure comprises a plurality of frequency specific predetermined values for a variety of operating frequencies. An operating condition of an integrated circuit is controlled via closed loop feedback based on dynamic operating indicators of the measured behavior of the integrated circuit.

In accordance with other embodiments of the present invention, a plurality of controllable input values to an integrated circuit is determined that achieves a desirably low power operating condition of the integrated circuit for a given operating frequency.

In accordance with yet other embodiments of the present invention, a dynamic operating condition of an integrated circuit is measured for a specific operating frequency at controllable input values that achieve an advantageous low power operating condition of the integrated circuit.

In one exemplary embodiment of the present invention, the integrated circuit is a microprocessor capable of operating at various frequencies and voltages.

DETAILED DESCRIPTION OF THE INVENTION

In the following detailed description of the present invention, system and method for frequency specific closed loop feedback control of integrated circuits, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Notation and Nomenclature

Some portions of the detailed descriptions that follow (e.g., process 200) are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "storing" or "dividing" or "computing" or "testing" or "calculating" or "determining" or "storing" or "measuring" or "adjusting" or "generating" or "performing" or "comparing" or "synchronizing" or "accessing'" or "retrieving'" or "conveying'" or "sending" or "resuming'" or "installing" or "gathering" or the like, refer to the action and processes of a computer system, or similar electronic computing device that manipulates and transforms data represented as physical (electronic) quantities within the computer system's registers and memories into other data similarly represented as physical quantities within the computer system memories or registers or other such information storage, transmission or display devices.

Frequency Specific Closed Loop Feedback Control of Integrated Circuits

Embodiments in accordance with the present invention are described in the context of design and operation of integrated semiconductors. More particularly, embodiments of the present invention relate to systems and methods for frequency specific closed loop feedback control of integrated circuits. It is appreciated, however, that elements of the present invention may be utilized in other areas of semiconductor operation.

Several operational indicators of an integrated circuit, e.g., a microprocessor, can be measured dynamically, e.g., in-situ while the integrated circuit is in operation. For example, the operating temperature of the integrated circuit can be measured. Such measurements can be external, e.g., via an applied thermocouple, or they can be made internally, e.g., via on-chip measurement circuits.

A wide variety of integrated circuit characteristics can be measured or determined, either directly or inferred from other characteristics, while the device is operating. For example, in addition to temperature, other characteristics such as gate delays, metal delays, leakage current, "on" current, relative behavior of NMOS and PMOS devices, maximum frequency and the like can be measured or determined for the instant operating conditions of an integrated circuit. Co-pending, commonly owned U.S. patent application Ser. No. 10/124,152, filed Apr. 16, 2002, now U.S. Pat. No. 6,882,172, entitled "System and Method for Measuring Transistor Leakage Current with a Ring Oscillator" and incorporated by reference herein, provides exemplary systems and methods of such dynamic determinations, or dynamic operating indicators, that are well suited to embodiments in accordance with the present invention.

Such measurements or indications are typically made available, e.g., to state machines and/or processor control software, via registers. Such register values frequently comprise a count of a number of events, e.g., oscillations of a ring oscillator in a given time interval. For the purpose of illustrating embodiments in accordance with the present invention, a model of a register reporting a value that is correlated to an operating characteristic of an integrated circuit is employed. It is to be appreciated, however, that embodiments in accordance with the present invention are well suited to a variety of systems and methods of determining and reporting dynamic operating conditions of an integrated circuit.

Figure 1:
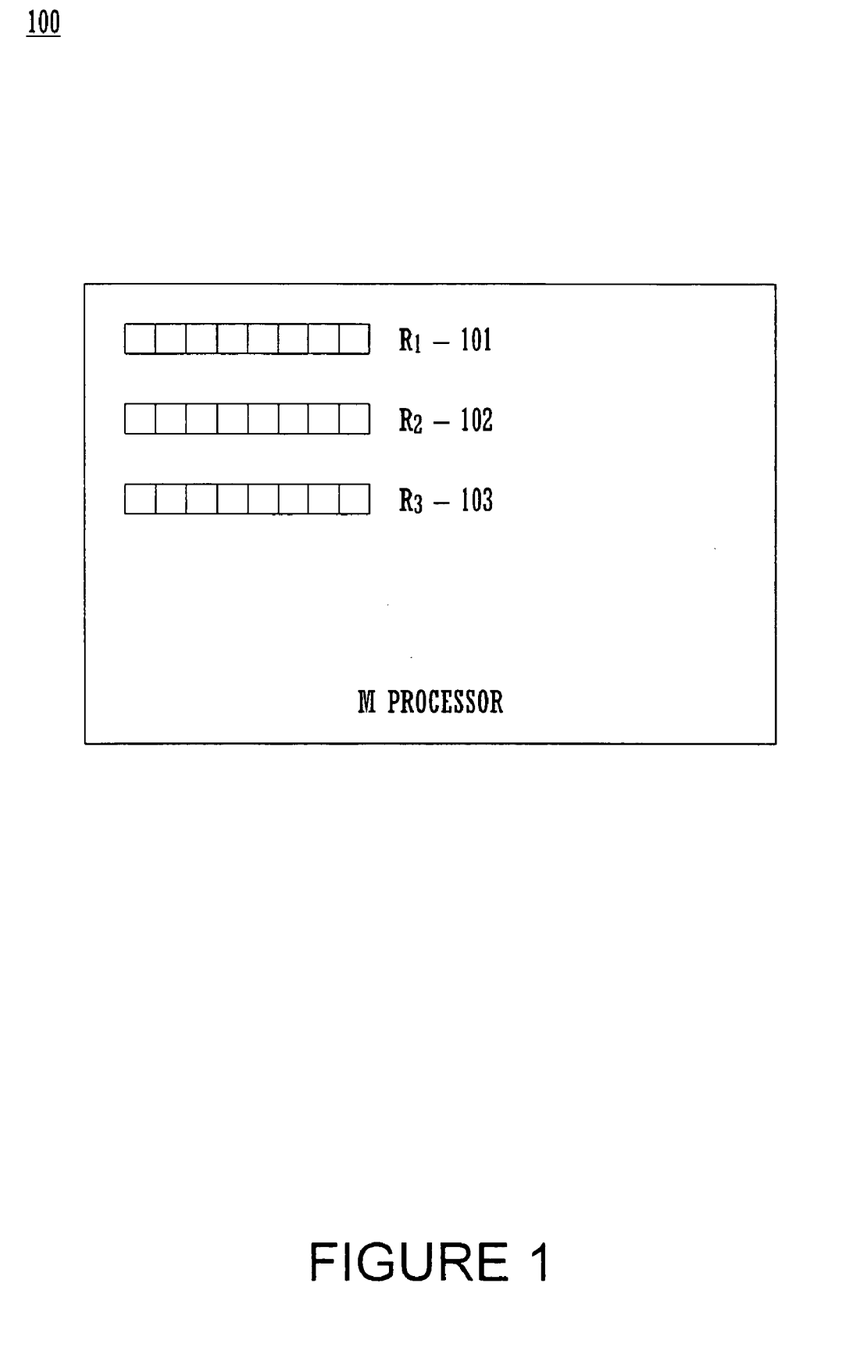
FIG. 1 illustrates a microprocessor comprising dynamic condition reporting registers, in accordance with embodiments of the present invention.

FIG. 1 illustrates a microprocessor 100 comprising dynamic condition reporting registers, in accordance with embodiments of the present invention. Dynamic condition reporting registers R1 101, R2 102 and R3 103 each indicate a dynamic condition metric of microprocessor 100. For example, generally each dynamic condition reporting register is associated with a dynamic condition measuring circuit either as a part of the integrated circuit or external to the integrated circuit.

Conversion of a measured quantity, e.g., oscillations of a ring oscillator, into a usable metric related to the measured quantity, e.g., a frequency measurement, e.g., in hertz, or a count of oscillations per unit time, can be embodied in either software or hardware, and all such embodiments are to be considered within the scope of the present invention. For example, logic circuitry can increment a counting register for each oscillation for a period of time. Alternatively, for example, a software timing loop, with or without hardware timing assistance, can count a number of oscillations per unit time. In accordance with embodiments of the present invention, dynamic condition reporting registers, e.g., dynamic condition reporting registers R1 101, R2 102 and R3 103, can refer to any memory location utilized to store such indications of a dynamic condition.

As operating conditions of microprocessor 100 change, values reported by dynamic condition reporting registers R1 101, R2 102 and R3 103 will generally change. For example, operating voltage and operating temperature are strong influences on a maximum operating frequency achievable by an integrated circuit. As operating voltage and/or operating temperature vary, so too in general will the values reported by dynamic condition reporting registers R1 101, R2 102 and R3 103.

For example, dynamic condition reporting register R1 101 can indicate a number of oscillations per time of a ring oscillator comprising complementary metal oxide inverter gates. Such a circuit can be utilized to indicate gate delays for the microprocessor at the instant operating conditions, e.g., operating temperature, operating voltage and the like. Similarly, other dynamic condition reporting registers can indicate other operational characteristics of microprocessor 100. For example, device leakage, gate leakage, temperature, metal delays, "on" current, behavior of n type and p type devices and/or relative behavior of n type and p type devices can be reported by dynamic condition reporting registers.

Most useful dynamic conditions indications will have a correlation with maximum achievable operating frequency of an integrated circuit at those operating conditions. For example, an indication of operating temperature will generally have a negative correlation with maximum achievable operating frequency. For example, as operating temperature increases, maximum achievable operating frequency decreases. Other dynamic condition indications may have a positive correlation with maximum achievable operating frequency. For example, the number of oscillations of a ring oscillator per unit time will generally increase as maximum achievable operating frequency of an integrated circuit increases.

Such correlations among dynamic conditions and maximum achievable operating frequency can be utilized in a system of closed loop feedback involving the condition registers, to optimize power consumption for operating an integrated circuit at a particular frequency.

Figure 2:
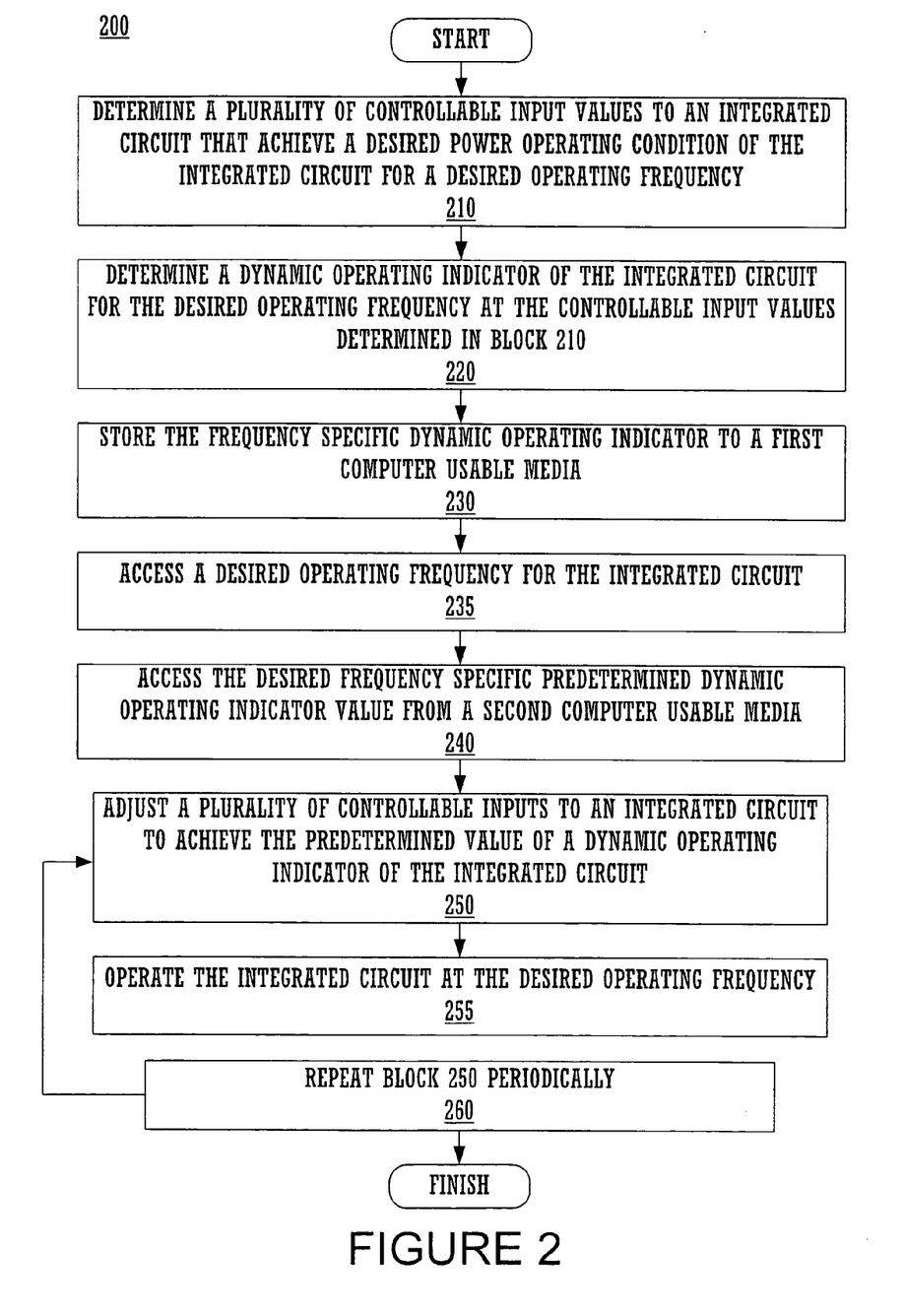
FIG. 2 illustrates a method of operating an integrated circuit, in accordance with embodiments of the present invention.

FIG. 2 illustrates a process 200 of operating an integrated circuit, in accordance with embodiments of the present invention. In optional block 210, a plurality of controllable input values to an integrated circuit is determined that achieves a desired power operating condition of the integrated circuit for a desired operating frequency. Such a desired operating frequency is usually one of a plurality of operating frequencies at which the integrated circuit is intended to operate. In accordance with one embodiment of the present invention, the condition is a desired low power operating condition. Exemplary controllable inputs to an integrated circuit can include, for example, operating voltage, a body biasing voltage applied to NMOS devices and/or a body biasing voltage applied to PMOS devices.

For example, an integrated circuit tester can run test vectors against an integrated circuit at a particular operating frequency for a fixed operating temperature. Controllable inputs to the integrated circuit, e.g., operating voltage and/or body biasing voltages, can be adjusted to decrease power consumption of the integrated circuit consistent with proper operation at the particular operating frequency. Power consumption of the integrated circuit should be minimized consistent with proper operation at the particular operating frequency.

In optional block 220, a dynamic operating indicator of the integrated circuit is observed for the specific operating frequency at the controllable input values determined in block 210. For example, a dynamic condition reporting register value corresponding to a ring oscillator can be read, either by an integrated circuit tester or under software control. It is to be appreciated that such dynamic operating conditions are generally determined in digital form, e.g., as a count of events. However, embodiments in accordance with the present invention are well suited to the use of analog condition reporting, e.g., a condition expressed as a voltage or charge stored on a floating gate. Blocks 210 and 220 can optionally be repeated for a plurality of different operating frequencies.

In optional block 230, the dynamic operating indicator value is stored to a first computer usable media. Such a dynamic operating condition value is well suited to a wide variety of storing methods and media. For example, such a value can be stored in non-volatile memory of the integrated circuit, in non-volatile memory of an integrated circuit package, or on media separate from the integrated circuit, e.g., on a separate non-volatile memory integrated circuit or in a computer system database. In accordance with an embodiment of the present invention, the indicator may be stored in a register of a microprocessor.

In block 235, a desired operating frequency for the integrated circuit is accessed. There are a variety of well known techniques for determining such a desirable operating frequency.

In optional block 240, the frequency specific predetermined dynamic operating indicator value is accessed from a second computer usable media. The frequency specific predetermined dynamic operating indicator value corresponds to the desired operating frequency accessed in block 235. It is to be appreciated that the first and second computer usable media can be the same media. Alternatively, the first and second computer usable media can be separate media. Embodiments in accordance with the present invention are well suited to utilizing a wide variety of media and techniques known to the data processing arts to transfer information of the dynamic operating condition between the first and second computer usable media.

In block 250, a plurality of controllable inputs to an integrated circuit is adjusted to achieve the predetermined value of a dynamic operating indicator of the integrated circuit. It is to be appreciated that, in general, each controllable input can be adjusted independently of other such controllable inputs. In some cases, a range of controllable input values, e.g., a body bias voltage, can be influenced by another controllable input value, e.g., operating voltage.

In block 255, the integrated circuit is operated at the desired operating frequency. In optional block 260, blocks 250 and 255 are periodically repeated.

In accordance with embodiments of the present invention, the predetermined dynamic operating condition can be determined for a specific integrated circuit or for a group of integrated circuits, e.g., those from a common wafer, a production run or by part number.

In accordance with other embodiments of the present invention, the predetermined dynamic operating condition may comprise evaluation of a function and/or lists of values. Such a function may present a condition that the system attempts to have dynamic operating indicators meet. For example, it may be desirable to control a combination of dynamic operating condition values. Referring once again to FIG. 1, the predetermined dynamic operating condition could be determined as three times the value of register R1 101 squared plus 17 times the value of register R2 102 plus the value of register R3 103. Other functions and/or operations, e.g., boundary operations such as MIN and MAX, can further be applied to dynamic operating condition values. All such manipulations of dynamic operating condition values to form a predetermined dynamic operating condition are well suited to embodiments in accordance with the present invention.

In this novel manner, an operating condition of an integrated circuit, e.g., power consumption of a microprocessor, can be advantageously controlled via closed loop feedback based on dynamic operating indicators of the integrated circuit's behavior for a desired operating frequency. Under the conventional art, controllable inputs to an integrated circuit, e.g., operating voltage, were based on open loop methods that provided, for example, a recommended operating voltage for a given operating frequency and temperature.

Figure 3A:
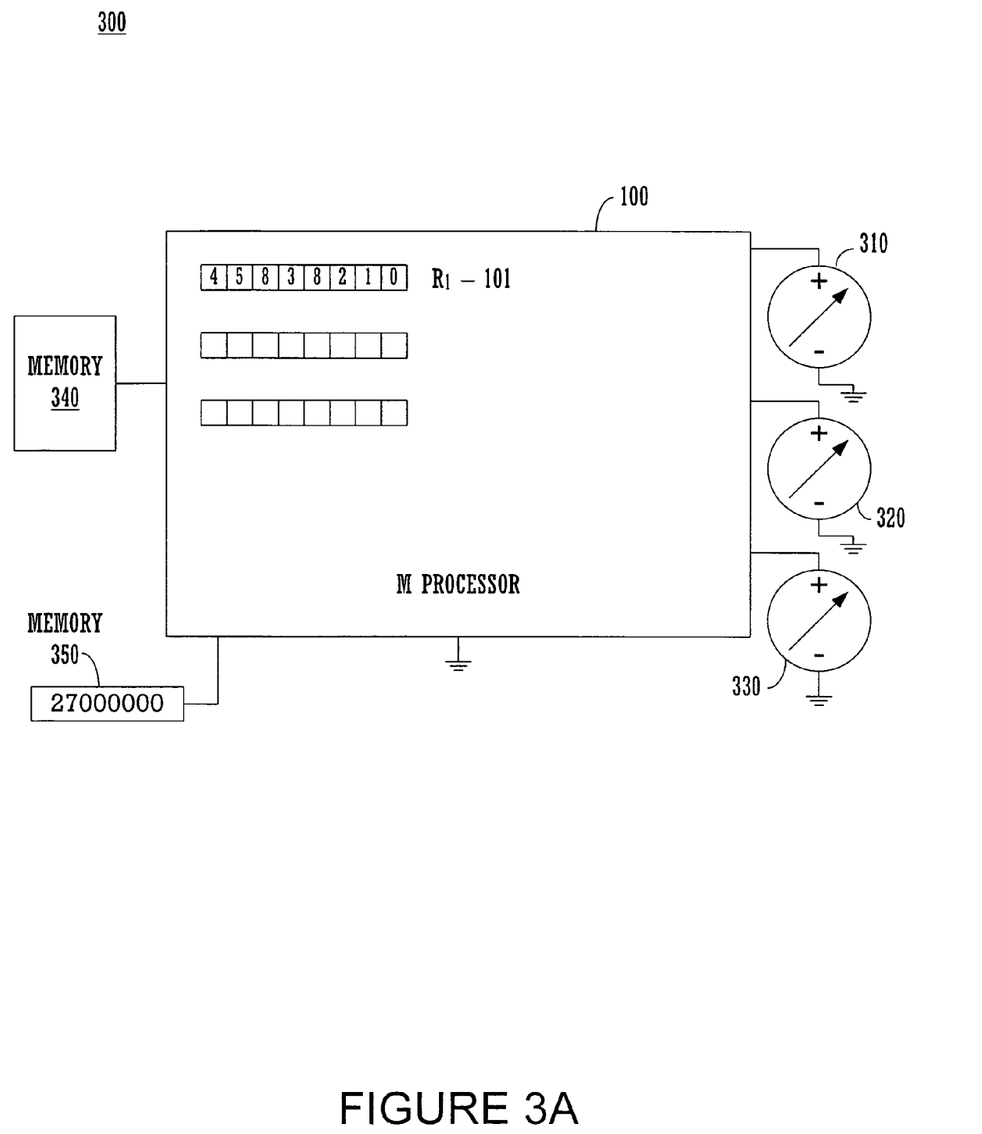
FIGS. 3A and 3B illustrate an exemplary application of portions of a method of operating an integrated circuit, in accordance with embodiments of the present invention.
Figure 3B:
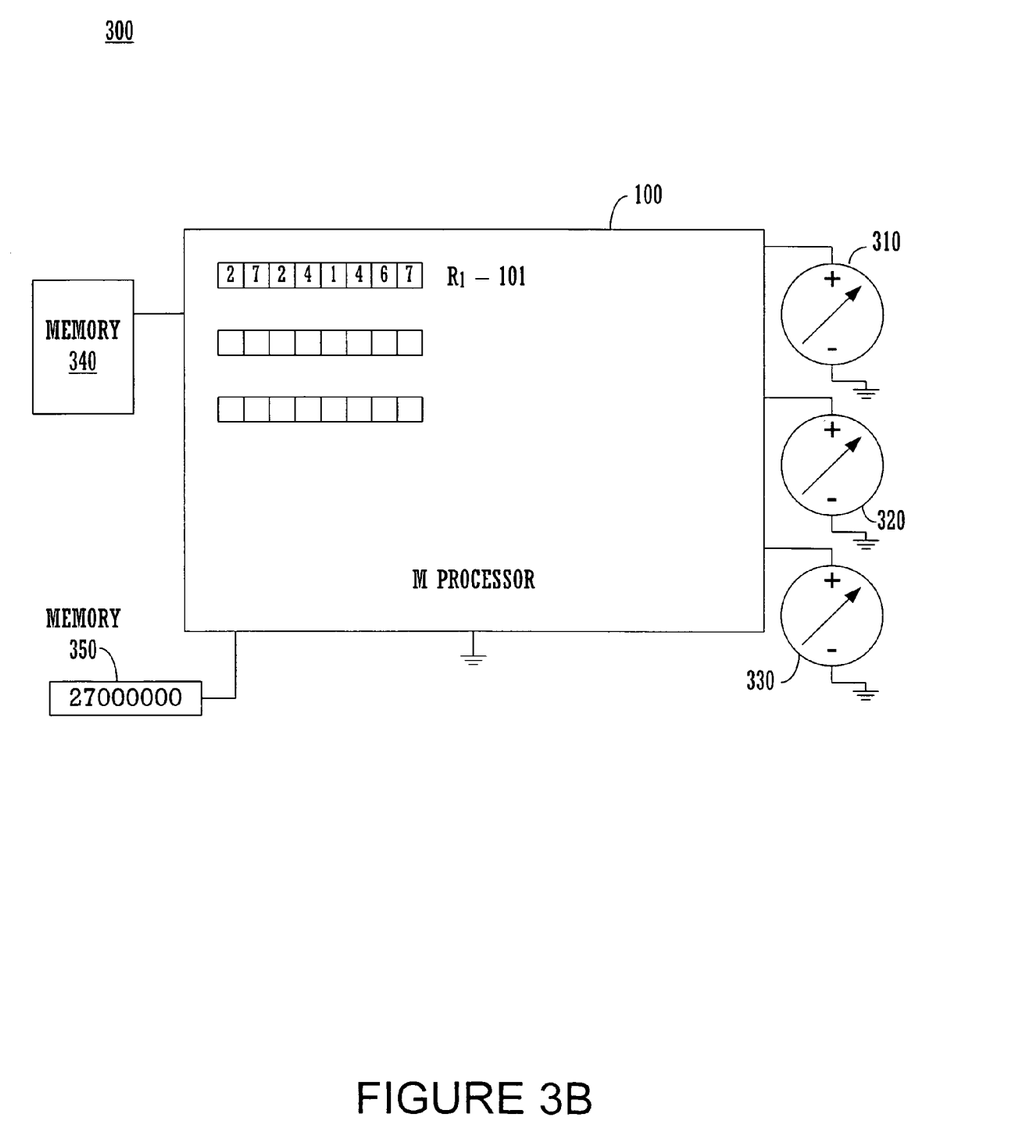

FIGS. 3A and 3B illustrate an exemplary application of portions of process 200, in accordance with embodiments of the present invention. Computer system 300 comprises microprocessor 100. Microprocessor 100 comprises dynamic condition reporting register R1 101. Dynamic condition reporting register R1 101 indicates a dynamic condition metric of microprocessor 100, e.g., a number of oscillations of a ring oscillator for a given time period. The time period may be externally measured. As operating conditions of microprocessor 100 change, values reported by dynamic condition reporting register R1 101 will generally change. For the purposes of the present example, assume that the value reported by dynamic condition reporting register R1 101 is positively correlated with maximum achievable operating frequency of microprocessor 100. For example, the greater the value in dynamic condition reporting register R1 101, the faster that microprocessor 100 can run. It is appreciated that embodiments in accordance with the present invention are well suited to negative correlations between dynamic condition reporting register values and maximum achievable operating frequency of a microprocessor.

Computer system 300 further comprises a first variable voltage supply 310 to provide an operating voltage to microprocessor 100. Optionally, computer system 300 can comprise a second variable voltage supply 320 to provide a body biasing voltage to n type devices, e.g., NMOS devices, of microprocessor 100. Similarly, computer system 300 can optionally comprise a third variable voltage supply 330 to provide a body biasing voltage to p type devices, e.g., PMOS devices, of microprocessor 100.

Computer system 300 also comprises a memory 340 coupled to microprocessor 100 that can be used to store data and programs for execution on microprocessor 100. Further, computer system 300 comprises a memory 350 for storing a predetermined value for a dynamic condition indicator. Memory 350 is well suited to being a part of memory 340, e.g., a location within memory 350.

The predetermined value for a dynamic condition indicator stored in memory 350, "27000000," represents a value of dynamic condition reporting register R1 101 that was previously determined. For example, this value can represent the value of dynamic condition reporting register R1 101 that corresponds to the lowest power operation of microprocessor 100 at a particular operating frequency, e.g., 500 MHz.

Referring now to FIG. 3A, at a point in time when microprocessor 100 is operating at 500 MHz, dynamic condition reporting register R1 101 reports a value of "45838210." Controllable inputs to microprocessor 100, e.g., operating voltage provided by first variable voltage supply 310 and body biasing voltages provided by second and third variable voltage supplies 320 and 330, are adjusted to achieve the predetermined value for dynamic condition reporting register R1 101, e.g., "27000000." For example, first variable voltage supply 310 can be commanded to reduce the operating voltage provided to microprocessor 100. It is to be appreciated that any or all controllable inputs can be adjusted in any combination and/or sequence in order to achieve the predetermined value for dynamic condition reporting register R1 101, in accordance with embodiments of the present invention.

Referring now to FIG. 3B, after such adjustments of controllable inputs to microprocessor 100, dynamic condition reporting register R1 101 reports a value of "27241467" that is very close to the predetermined value for dynamic condition reporting register R1 101, "27000000." It is to be appreciated that the actual predetermined value for dynamic condition reporting register R1 101 may not be achievable for a variety of reasons, including, for example, an operating temperature difference for microprocessor 100 between the point when the predetermined value for dynamic condition reporting register R1 101 was determined and the point in time represented by FIG. 3B.

Figure 4:
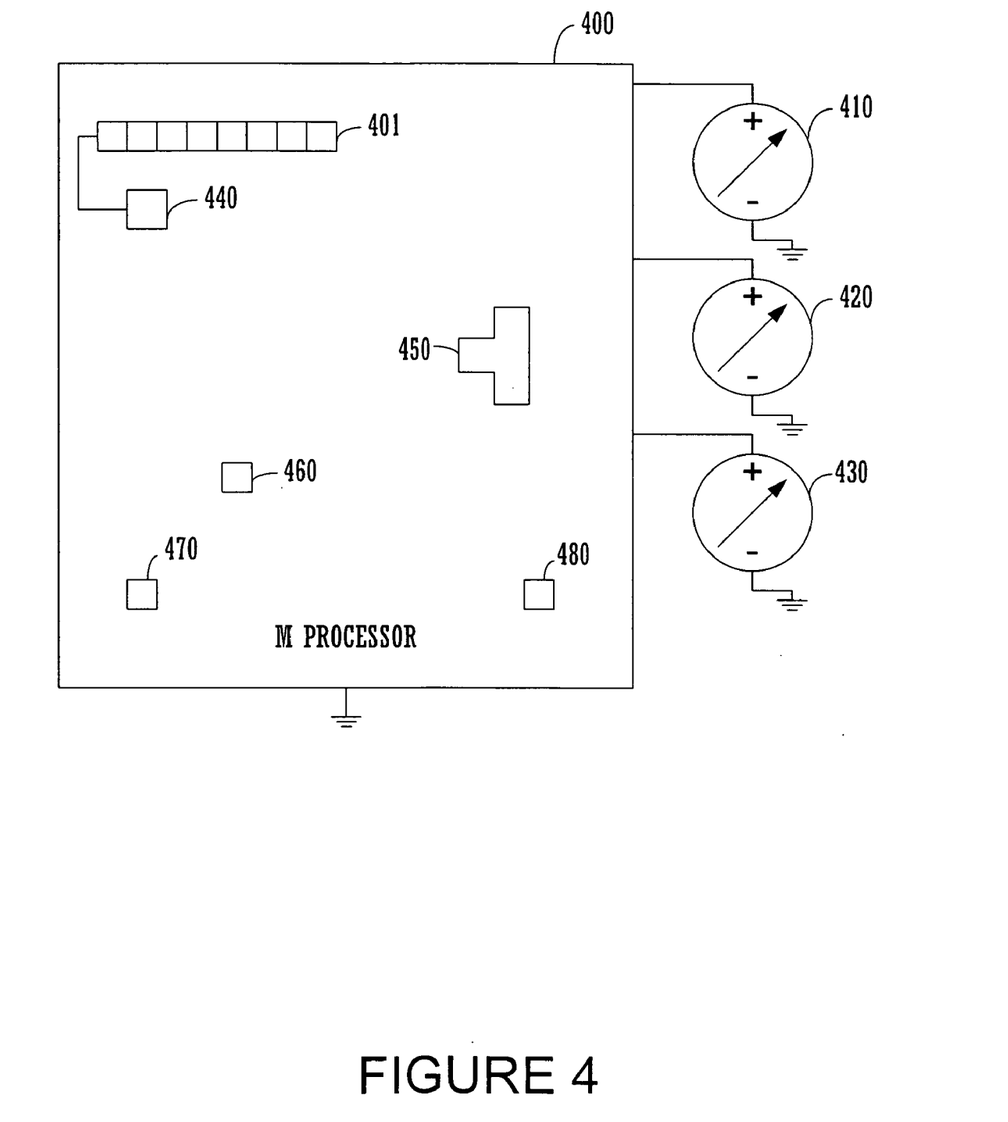
FIG. 4 illustrates a microprocessor, in accordance with embodiments of the present invention.

FIG. 4 illustrates a microprocessor 400, in accordance with embodiments of the present invention. Microprocessor 400 is configured to operate at a plurality of operating frequencies from a plurality of variable voltage supplies or controllable inputs, e.g., variable voltage supplies 410, 420 and 430. Variable voltage supply 410 provides a variable operating voltage to microprocessor 400. Variable voltage supply 420 provides a variable body biasing voltage to n type devices, e.g., NMOS devices, of microprocessor 400. Variable voltage supply 430 provides a variable body biasing voltage to p type devices, e.g., PMOS devices, of microprocessor 400.

Microprocessor 400 further comprises a plurality of dynamic operating indicators for indicating operating conditions of microprocessor 400, e.g., dynamic operating indicator circuits 440, 450, 460, 470, and 480. One or more of dynamic operating indicator circuits 440, 450, 460, 470, and 480 are well suited to the systems and methods taught in co-pending, commonly owned U.S. patent application Ser. No. 10/124,152, filed Apr. 16, 2002, now U.S. Pat. No. 6,882,172, entitled "System and Method for Measuring Transistor Leakage Current with a Ring Oscillator" and incorporated by reference herein.

Typically such dynamic operating indicator circuits will be situated in a variety of locations throughout a microprocessor integrated circuit. A wide variety of factors, including semiconductor process variation across an integrated circuit and other well known circuit layout influences, should be utilized to determine where such dynamic operating indicator circuits. Generally, each dynamic operating indicator circuit, e.g., dynamic operating indicator circuit 440, will have an associated dynamic operating indicator, e.g., register 401. The dynamic operating indicator 401 presents a measurement of a current integrated circuit operating characteristic, as measured by a dynamic operating indicator circuit, to microprocessor circuitry and/or software in a straightforward manner. It is to be appreciated that a direct correspondence between dynamic operating indicator circuits and dynamic operating indicators is exemplary, and that other structures to determine a current integrated circuit operating characteristic are well suited to embodiments in accordance with the present invention.

Figure 5:
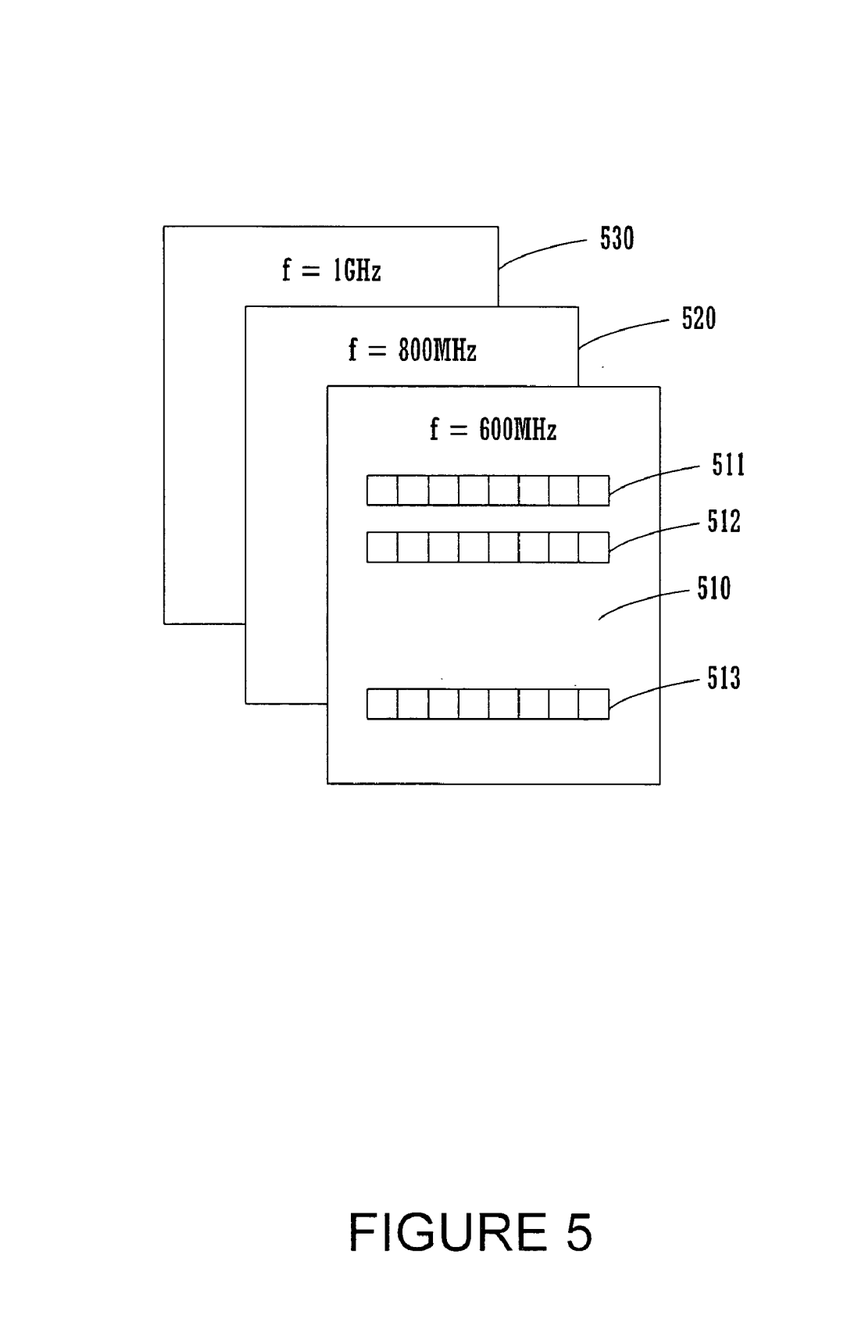
FIG. 5 illustrates a data structure stored in a computer readable media, in accordance with embodiments of the present invention.

FIG. 5 illustrates a data structure 500 stored in a computer readable media, in accordance with embodiments of the present invention. Data structure 500 is well suited to embodiment in a wide variety of computer usable media, including random access memories (RAM), read only memories (ROM), cache memories and storage devices, e.g., flash memory or magnetic storage.

Data structure 500 comprises a plurality of sets of dynamic operating indicator values, for example dynamic operating indicator set values 510, 520 and 530. Each set or "record" of dynamic operating indicator values comprises values of dynamic operating indicators that achieve a desired power operating condition of the integrated circuit for a specific operating frequency. Therefore, each record instantiation is specific for an operating frequency. Alternatively, in accordance with other embodiments of the present invention, a function can provide dynamic operating indicator values for a plurality of frequencies.

It is to be appreciated that the dynamic operating indicator values need not indicate a value in any standard units, e.g., nanoseconds. Rather, the dynamic operating indicator values should correspond to values of dynamic operating indicators, e.g., registers R1 101, R2 102 and/or R3 103 of FIG. 1.

As shown in data structure 500, dynamic operating indicator set 510 is a set of dynamic operating indicator values for an operating frequency of 600 MHz. Similarly, dynamic operating indicator set 520 is a set of dynamic operating indicator values for an operating frequency of 800 MHz. Likewise, dynamic operating indicator set 530 is a set of dynamic operating indicator values for an operating frequency of 1 GHz.

For example, referring once again to FIG. 1, the values of dynamic condition reporting registers R1 101, R2 102 and R3 103 can be recorded for a desired power operating condition, e.g., minimum power, of microprocessor 100 at an operating frequency of 600 MHz. Referring back to FIG. 5, such values are stored in memory locations 511, 512 and 513 of dynamic operating indicator set 510. In accordance with other embodiments of the present invention, a function, e.g., f(R1, R2, R3) can be controlled to meet a predetermined condition, e.g., f(R1, R2, R3) equals zero.

Similarly, the values of dynamic condition reporting registers R1 101, R2 102 and R3 103 can be recorded for a desired power operating condition, e.g., minimum power, of microprocessor 100 at an operating frequency of 800 MHz. Such values are stored in dynamic operating indicator set 520. Likewise, the values of dynamic condition reporting registers R1 101, R2 102 and R3 103 can be recorded for a desired power operating condition, e.g., minimum power, of microprocessor 100 at an operating frequency of 1 GHz. Such values are stored in dynamic operating indicator set 520.

Embodiments in accordance with the present invention, systems and methods for frequency specific closed loop feedback control of integrated circuits, are thus described. While the present invention has been described in particular embodiments, it should be appreciated that the present invention should not be construed as limited by such embodiments, but rather construed according to the below claims.

What is claimed is:

1. A method of operating an integrated circuit, said method comprising:
    accessing a desired operating frequency for said integrated circuit;
    measuring a current dynamic operating indicator of said integrated circuit;
    adjusting a plurality of controllable inputs to said integrated circuit to approach a predetermined value of said dynamic operating indicator of said integrated circuit, wherein said predetermined value is specific to said desired operating frequency; and
    operating said integrated circuit at said desired operating frequency.

2. A method as described in claim 1 further comprising accessing said predetermined value from a computer usable media.

3. A method as described in claim 2 further comprising periodically repeating said measuring and said adjusting.

4. A method as described in claim 1 wherein said plurality of controllable inputs comprises an operating voltage of said integrated circuit.

5. A method as described in claim 1 wherein said plurality of controllable inputs comprises a body bias voltage.

6. A method as described in claim 5 wherein said body bias voltage comprises a voltage applied to an n type metal oxide semiconductor device of said integrated circuit.

7. A method as described in claim 5 wherein said body bias voltage comprises a voltage applied to a p type metal oxide semiconductor device of said integrated circuit.

8. A method as described in claim 1 further comprising determining said predetermined value of a dynamic operating indicator of said integrated circuit for said desired operating frequency.

9. A method as described in claim 8 further comprising storing said predetermined value of a dynamic operating indicator of said integrated circuit in a computer usable media.

10. A method as described in claim 9 wherein said predetermined value is stored in a data structure that comprises a plurality of predetermined values, each associated with a different operating frequency.

11. A method as described in claim 2 wherein said dynamic operating indicator indicates a gate delay of said integrated circuit.

12. A method as described in claim 2 wherein said dynamic operating indicator indicates an off current of said integrated circuit.

13. A method as described in claim 2 wherein said dynamic operating indicator indicates a gate leakage of said integrated circuit.

14. A method as described in claim 2 wherein said dynamic operating indicator indicates a behavior of one type of device selected from the set of NMOS devices and PMOS devices of said integrated circuit.

15. A system for operating an integrated circuit at a specific operating frequency, said system comprising:
    circuitry for measuring a current dynamic operation indicator of said integrated circuit; and
    a feedback loop coupled to said circuitry, said feedback loop for optimizing a dynamic operating indicator of said integrated circuit toward a predetermined value of said dynamic operating indicator by controlling a plurality of controllable inputs to said integrated circuit, wherein said predetermined value is specific for said specific operating frequency.

16. A system as described in claim 15 further comprising a computer usable media to store said predetermined value of said dynamic operating indicator, wherein said predetermined value is stored in a data structure associated with a record that is specific for said operating frequency.

17. A system as described in claim 15 wherein said data structure comprises a plurality of predetermined values, each associated with a different operating frequency.

18. A system as described in claim 15 wherein said plurality of controllable inputs comprises an operating voltage of said integrated circuit.

19. A system as described in claim 15 wherein said plurality of controllable inputs comprises a body bias voltage.

20. A system as described in claim 19 wherein said body bias voltage comprises a voltage applied to an n type metal oxide semiconductor device of said integrated circuit.

21. A system as described in claim 19 wherein said body bias voltage comprises a voltage applied to a p type metal oxide semiconductor device of said integrated circuit.

22. A system as described in claim 15 wherein said dynamic operating indicator indicates a gate delay of said integrated circuit.

23. A system as described in claim 15 wherein said dynamic operating indicator indicates an off current of said integrated circuit.

24. A system as described in claim 15 wherein said dynamic operating indicator indicates a gate leakage of said integrated circuit.

25. A system as described in claim 15 wherein said dynamic operating indicator indicates a behavior of one type of device selected from the set of NMOS devices and PMOS devices of said integrated circuit.

26. A method as described in claim 1 wherein said predetermined value is a function.

* * * * *